(12) United States Patent
Teysseyre et al.

(10) Patent No.: US 11,735,508 B2
(45) Date of Patent: Aug. 22, 2023

(54) VERTICAL AND HORIZONTAL CIRCUIT ASSEMBLIES

(71) Applicant: SEMICONDUCTOR COMPONENTS INDUSTRIES, LLC, Phoenix, AZ (US)

(72) Inventors: Jerome Teysseyre, Scottsdale, AZ (US); Romel Manatad, Liloan (PH); Chung-Lin Wu, San Jose, CA (US); Bigildis Dosdos, San Jose, CA (US); Erwin Ian Almagro, Lapu-Lapu (PH); Maria Cristina Estacio, Lapulapu (PH)

(73) Assignee: SEMICONDUCTOR COMONENTS INDUTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/453,623

(22) Filed: Nov. 4, 2021

(65) Prior Publication Data

US 2022/0059443 A1 Feb. 24, 2022

Related U.S. Application Data

(63) Continuation of application No. 16/279,336, filed on Feb. 19, 2019, now Pat. No. 11,177,203, which is a (Continued)

(51) Int. Cl.
*H01L 23/498* (2006.01)
*H01L 23/495* (2006.01)

(52) U.S. Cl.
CPC ...... *H01L 23/49827* (2013.01); *H01L 23/495* (2013.01); *H01L 23/49575* (2013.01);
(Continued)

(58) Field of Classification Search
CPC .................. H01L 23/495; H01L 23/49575
See application file for complete search history.

(56) References Cited

U.S. PATENT DOCUMENTS

| 5,543,740 A | 8/1996 | Wong |
| 6,008,074 A | 12/1999 | Brand |

(Continued)

OTHER PUBLICATIONS

U.S. Appl. No. 15/692,354, filed Aug. 31, 2017, Patented.
U.S. Appl. No. 16/279,336, filed Feb. 19, 2019, Allowed.

*Primary Examiner* — Bilkis Jahan
*Assistant Examiner* — Victor V Barzykin
(74) *Attorney, Agent, or Firm* — Brake Hughes Bellermann LLP

(57) ABSTRACT

In a general aspect, an apparatus can include a leadframe including a plurality of leads disposed along a single edge of the apparatus. The apparatus can also include an assembly including a substrate and a plurality of semiconductor die disposed on the substrate, the assembly being mounted on the leadframe and an inductor having a first terminal and a second terminal. The first terminal of the inductor can be electrically coupled with the leadframe via a first contact pad of the leadframe. The second terminal of the inductor can be electrically coupled with the leadframe via a second contact pad of the leadframe. The first contact pad and the second contact pad can be exposed through a molding compound by respective mold cavities defined in the molding compound. The leadframe, the assembly and the inductor can be arranged in a stacked configuration.

20 Claims, 9 Drawing Sheets

Related U.S. Application Data continuation of application No. 15/692,354, filed on Aug. 31, 2017, now Pat. No. 10,256,178.

(60) Provisional application No. 62/383,753, filed on Sep. 6, 2016.

(52) U.S. Cl.
CPC .............. *H01L 23/49586* (2013.01); *H01L 2224/48137* (2013.01); *H01L 2224/48247* (2013.01)

(56) References Cited

U.S. PATENT DOCUMENTS

| | | | |
|---|---|---|---|
| 6,323,549 B1 | 11/2001 | deRochemont et al. | |
| 7,047,637 B2 | 5/2006 | deRochemont et al. | |
| 7,068,097 B2 | 6/2006 | Atmur | |
| 7,227,198 B2 | 6/2007 | Pavier et al. | |
| 7,301,235 B2 | 11/2007 | Schaffer et al. | |
| 7,425,757 B2 | 9/2008 | Takubo | |
| 7,492,043 B2 | 2/2009 | Choi et al. | |
| 7,675,148 B2 | 3/2010 | Lim et al. | |
| 7,736,397 B2 | 6/2010 | Lee et al. | |
| 8,198,139 B2 | 6/2012 | Yang | |
| 8,289,678 B2 | 10/2012 | Kim et al. | |
| 8,604,611 B2 | 12/2013 | Hauenstein | |
| 9,607,917 B2 * | 3/2017 | Moussaoui | H01L 23/3107 |
| 10,111,333 B2 * | 10/2018 | Yin | H05K 1/18 |
| 10,340,210 B2 * | 7/2019 | Khoo | H01L 23/3114 |
| 2003/0031339 A1 | 2/2003 | Marshall et al. | |
| 2008/0179722 A1 * | 7/2008 | Chen | H01L 23/49555 257/666 |
| 2009/0168388 A1 * | 7/2009 | Wong | H01L 23/49589 361/813 |
| 2010/0123995 A1 | 5/2010 | Otsuka et al. | |
| 2010/0328902 A1 * | 12/2010 | Ho | H01L 23/645 361/748 |
| 2011/0228507 A1 * | 9/2011 | Yin | H05K 1/18 361/811 |
| 2012/0063038 A1 * | 3/2012 | Yin | H05K 9/0007 361/18 |
| 2012/0299150 A1 * | 11/2012 | Tang | H01L 23/645 438/123 |
| 2012/0313229 A1 * | 12/2012 | Lee | H01L 23/49568 438/122 |
| 2013/0001756 A1 * | 1/2013 | Chen | H01L 23/49811 257/666 |
| 2015/0102475 A1 * | 4/2015 | Lee | H01L 25/165 257/675 |
| 2015/0214200 A1 | 7/2015 | Tan et al. | |
| 2016/0079146 A1 | 3/2016 | Kasemset et al. | |
| 2017/0179048 A1 * | 6/2017 | Moussaoui | H01L 23/645 |
| 2018/0082930 A1 * | 3/2018 | Khoo | H01L 21/565 |

\* cited by examiner

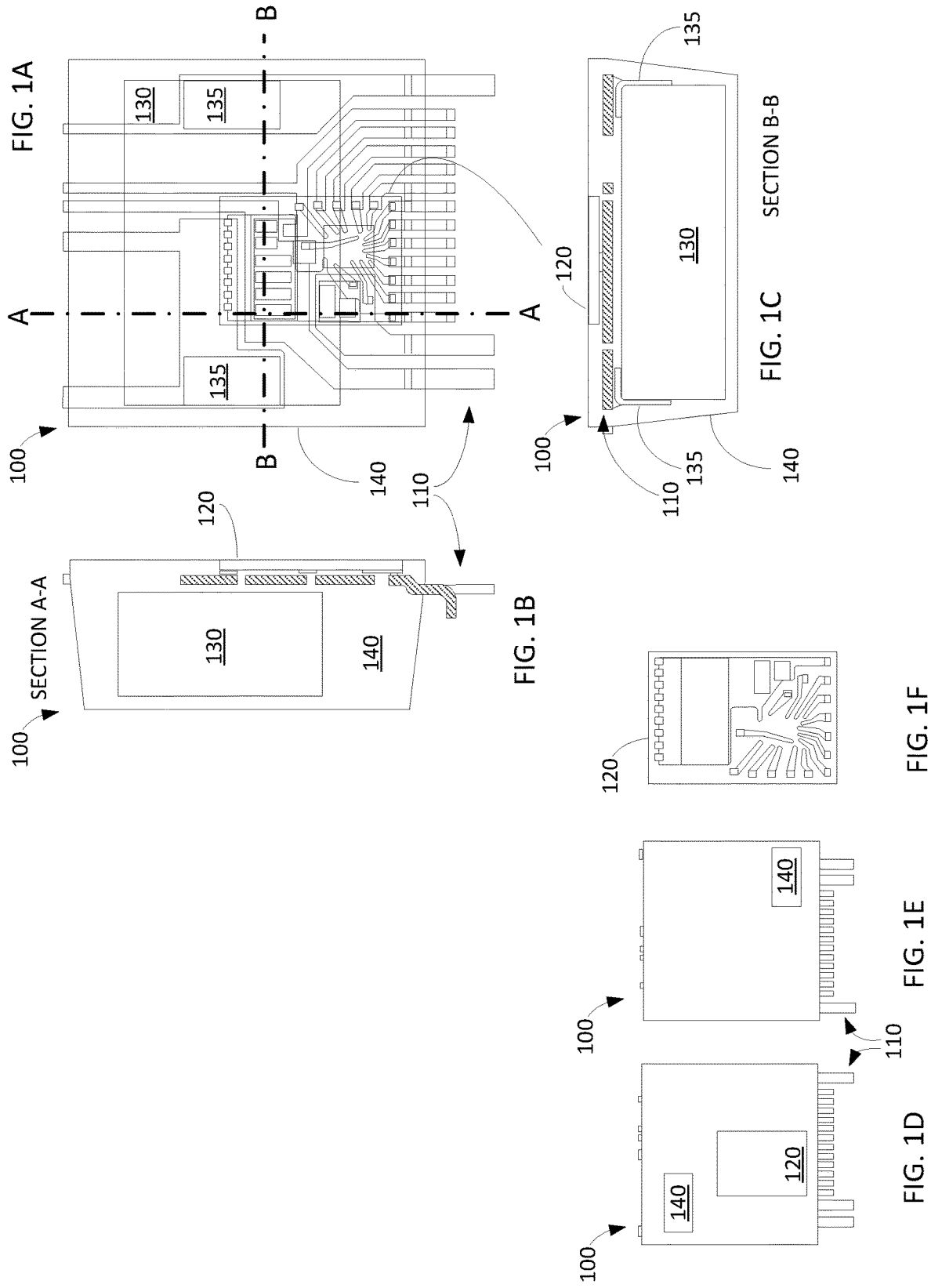

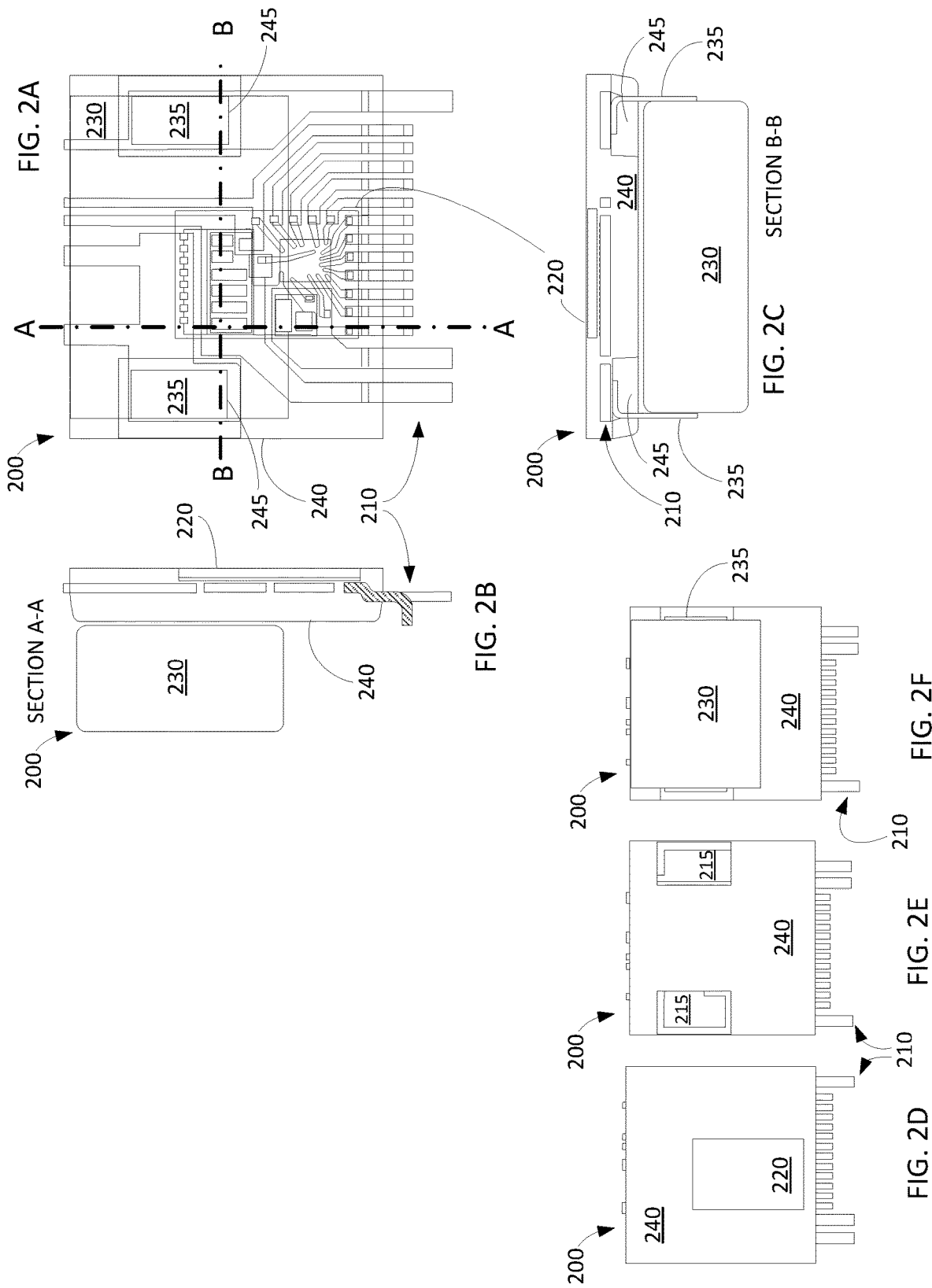

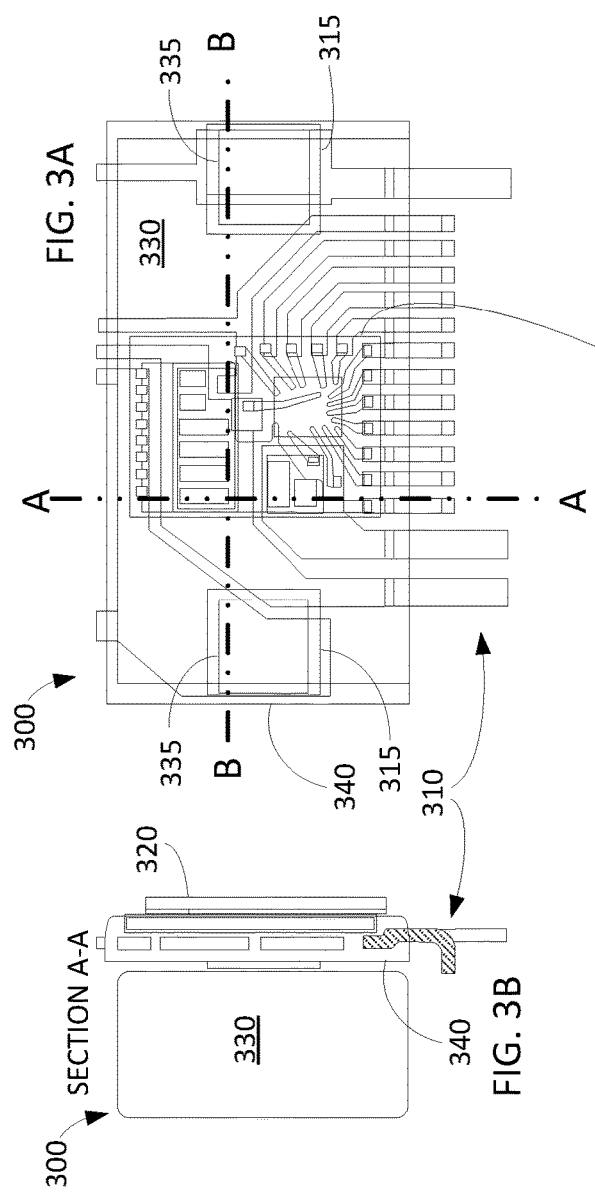
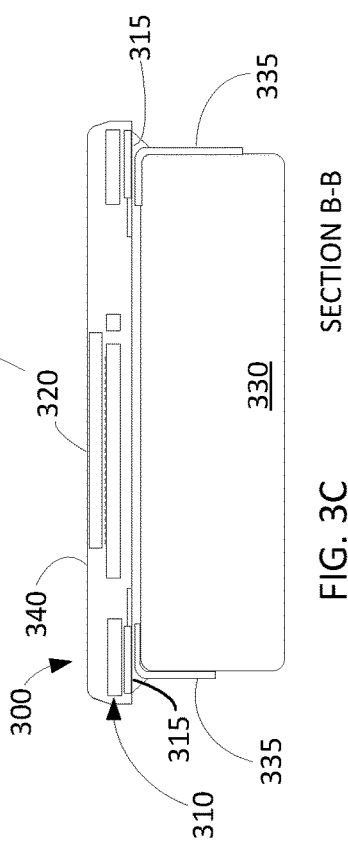
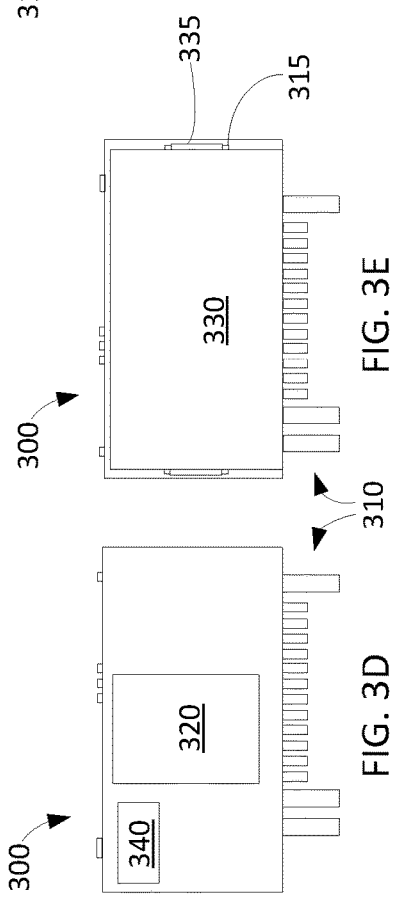
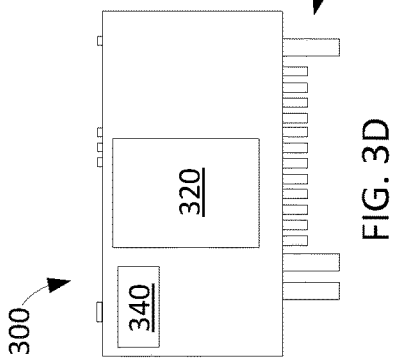

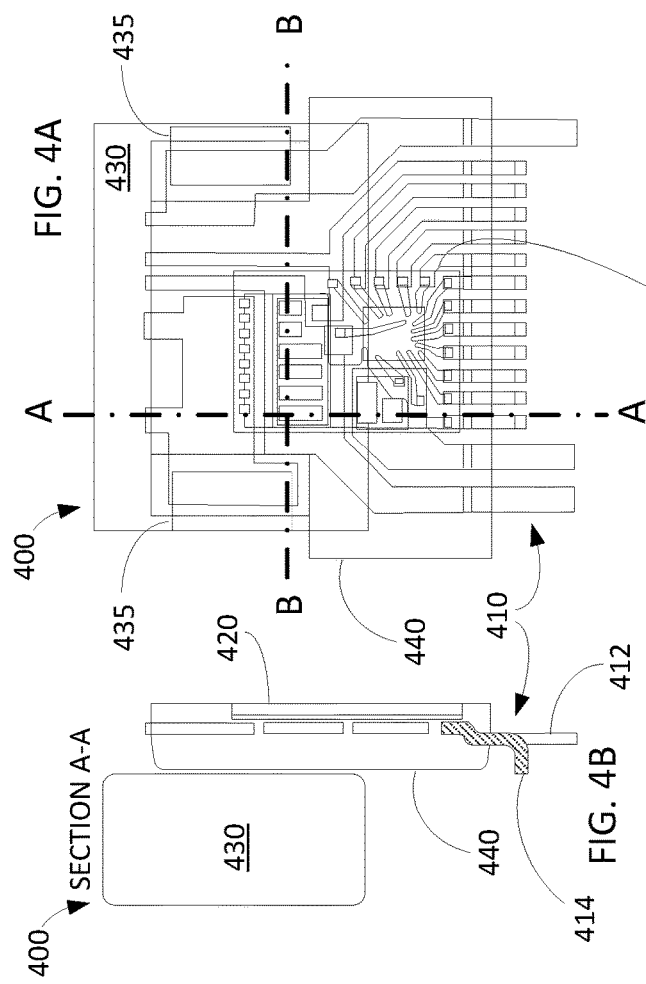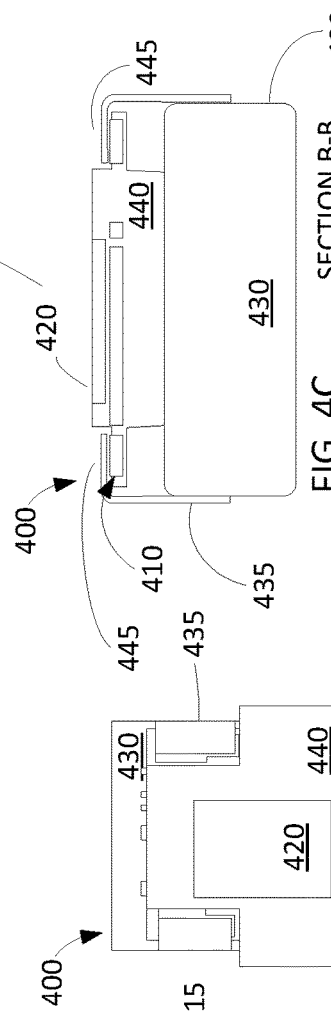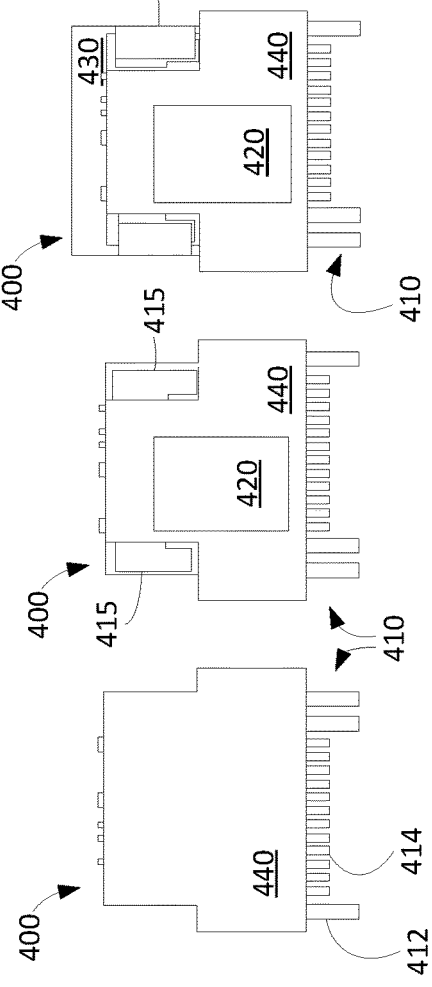

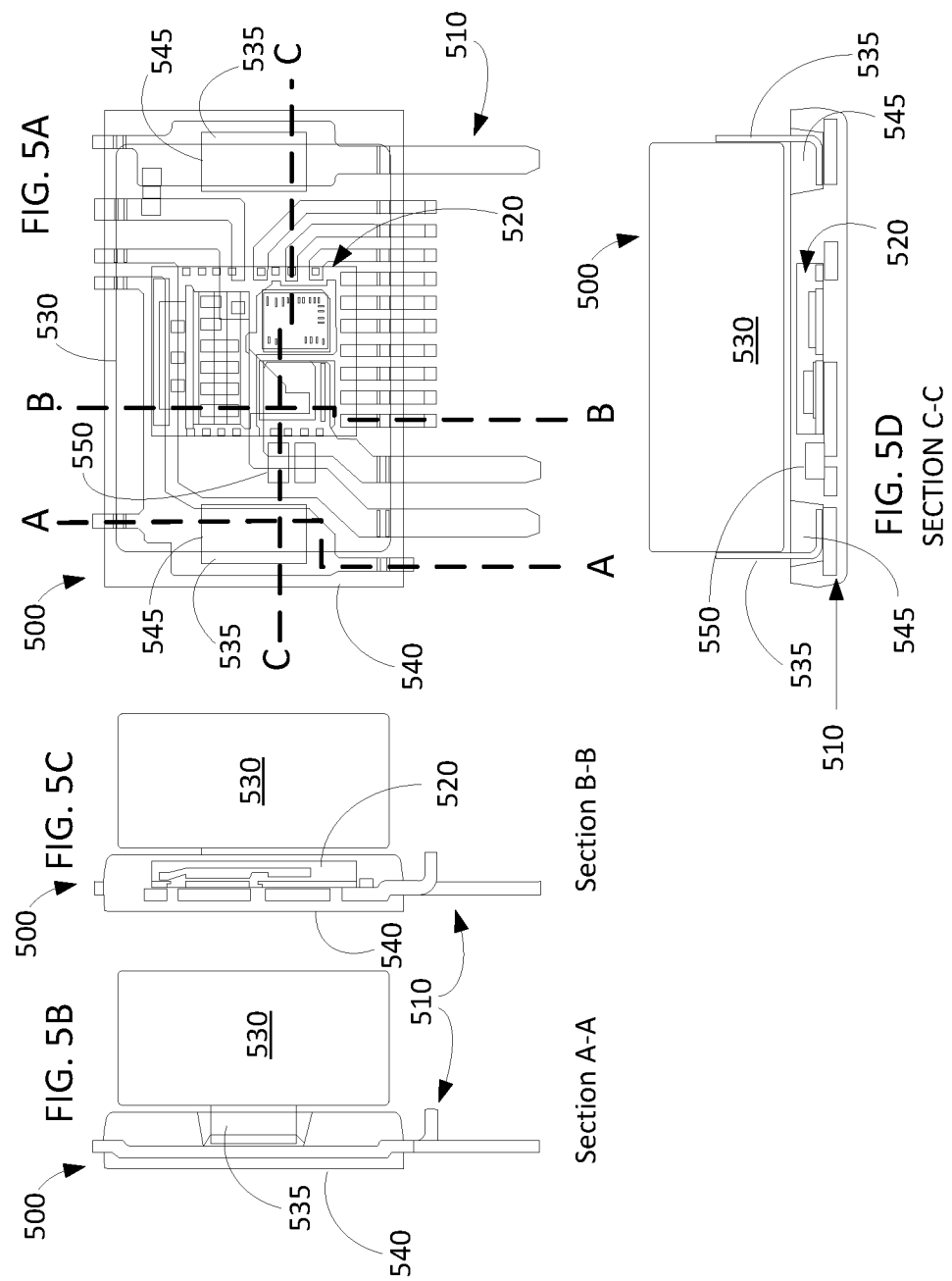

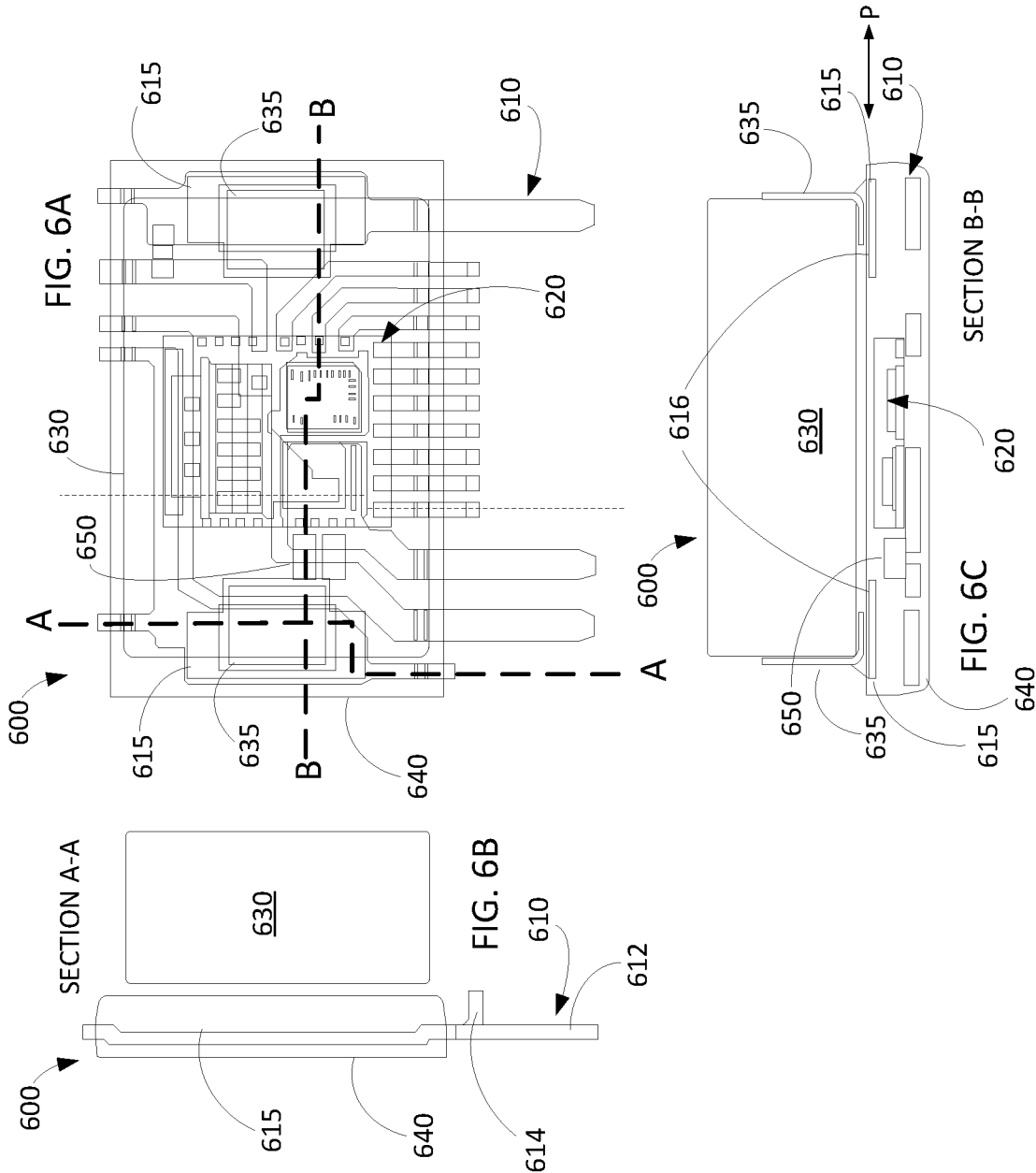

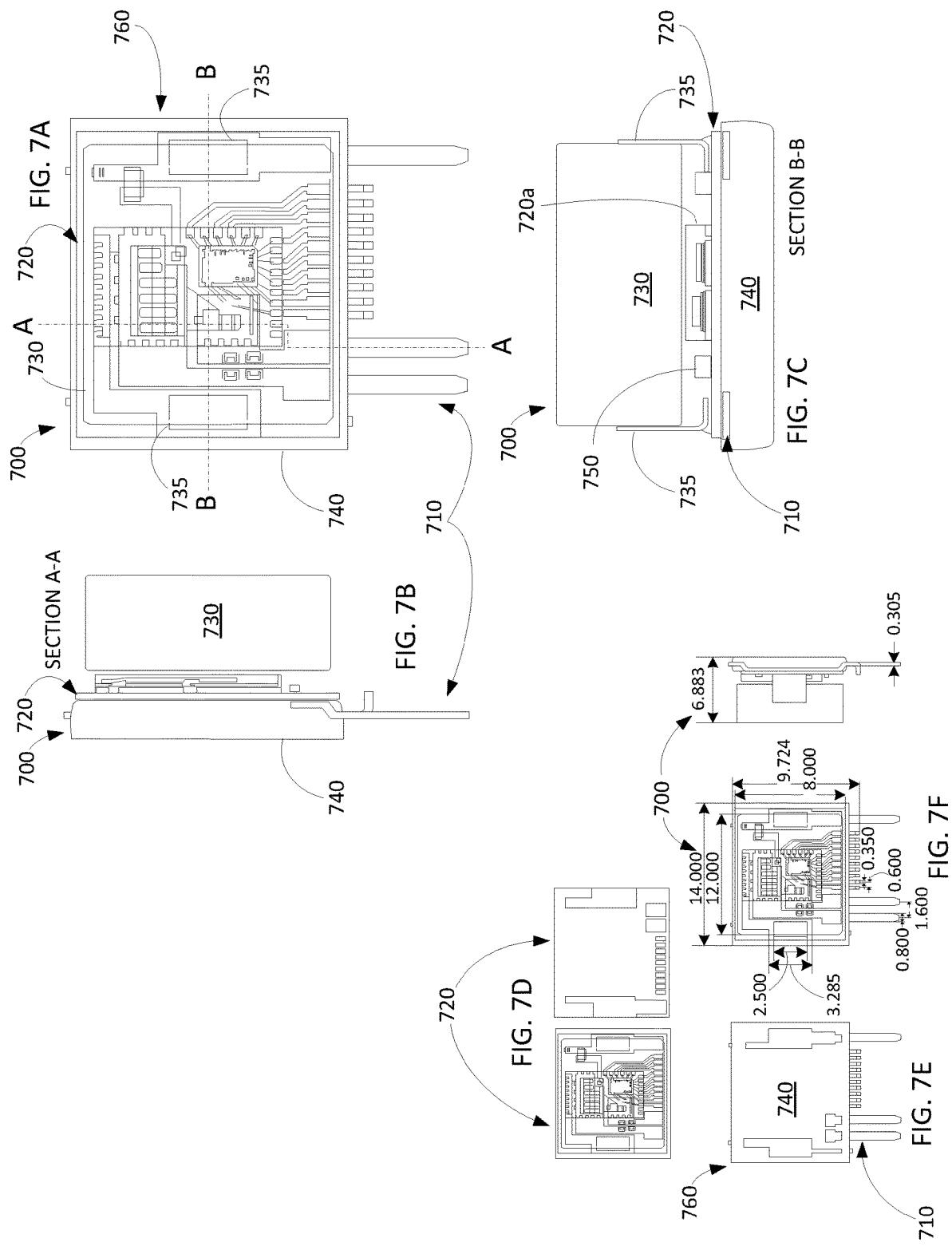

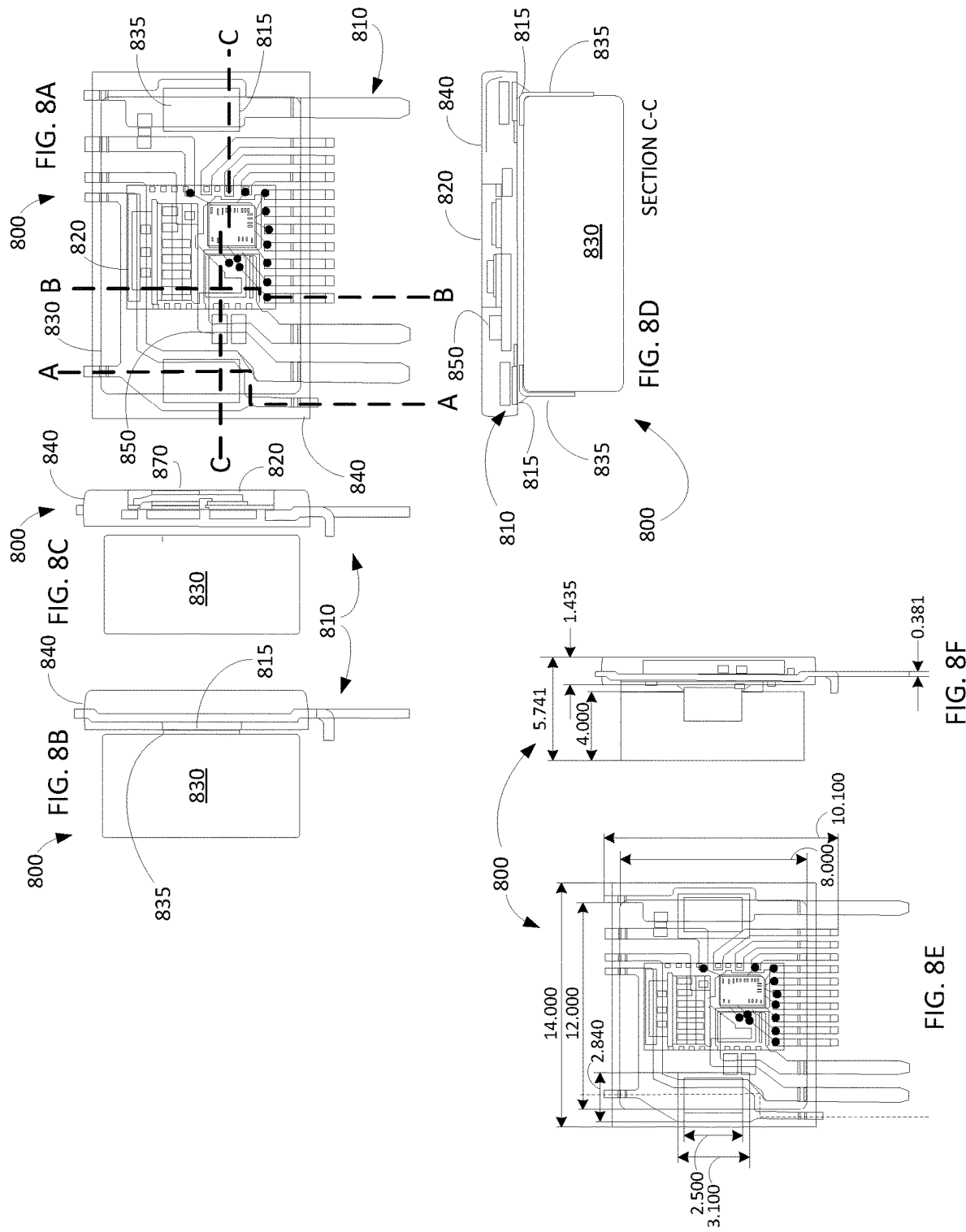

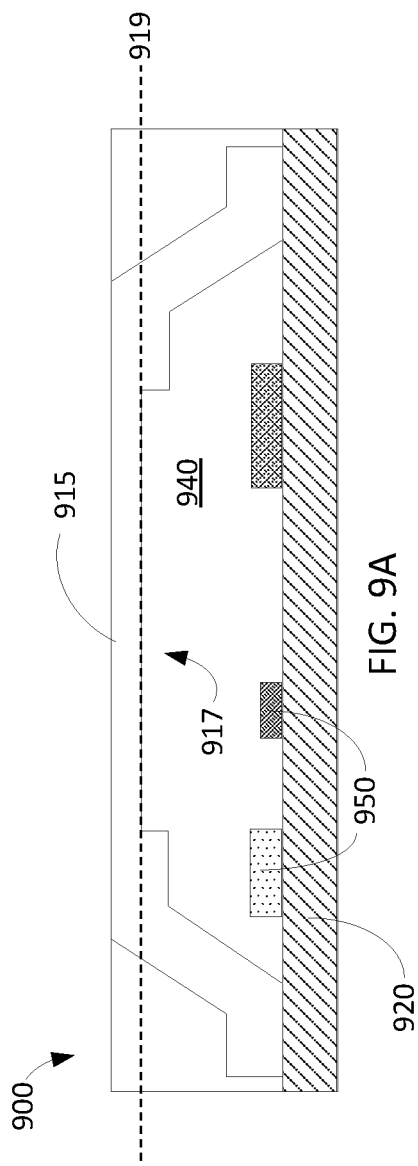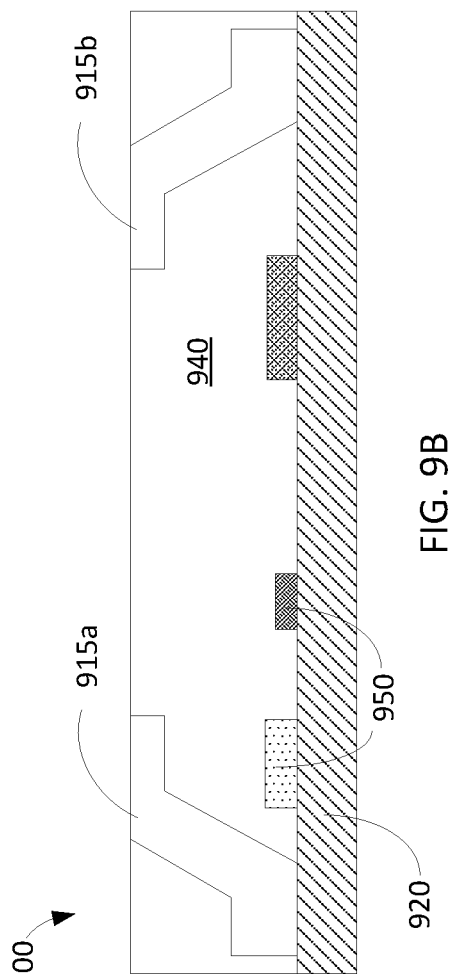

VERTICAL AND HORIZONTAL CIRCUIT ASSEMBLIES

CROSS-REFERENCE TO RELATED APPLICATION

This application is a continuation of U.S. patent application Ser. No. 16/279,336, filed on Feb. 19, 2019, which is a continuation of U.S. patent application Ser. No. 15/692,354, filed on Aug. 31, 2017, now U.S. Pat. No. 10,256,178, which claims priority to and the benefit of U.S. Provisional Application No. 62/383,753, filed Sep. 6, 2016, all entitled "VERTICAL AND HORIZONTAL CIRCUIT ASSEMBLIES", the disclosures of which are hereby incorporated by reference in their entirety.

TECHNICAL FIELD

This description relates to circuit assemblies the can be mounted to a printed circuit board. More specifically, this description relates to circuit assemblies that can be vertically mounted (attached, affixed, etc.) to a printed circuit board (which can be referred to as vertical circuit assemblies) and to circuit assemblies that can be either vertically implemented or horizontally implemented.

SUMMARY

In a general aspect, an apparatus can include a leadframe including a plurality of leads and an assembly including a substrate and a plurality of semiconductor die disposed on the substrate. The assembly can be coupled to the leadframe. The apparatus can also include a molding compound that at least partially encapsulates the leadframe and the assembly, an inductor having a first terminal and a second terminal. The first terminal of the inductor can be electrically coupled with a first contact pad of the leadframe. The first contact pad can be exposed through the molding compound by a mold cavity defined in the molding compound. At least a portion of the first terminal can be disposed in the mold cavity. The second terminal of the inductor can be electrically coupled with a second contact pad of the leadframe. The leadframe, the assembly and the inductor can be arranged in a stacked configuration.

BRIEF DESCRIPTION OF THE DRAWINGS

FIGS. 1A-1F are diagrams illustrating a vertical circuit assembly and components of that circuit assembly, according to an implementation.

FIGS. 2A-2F are diagrams illustrating another vertical circuit assembly and components of that circuit assembly, according to an implementation.

FIGS. 3A-3E are diagrams illustrating another vertical circuit assembly and components of that circuit assembly, according to an implementation.

FIGS. 4A-4F are diagrams illustrating another vertical circuit assembly and components of that circuit assembly, according to an implementation.

FIGS. 5A-5D are diagrams illustrating another vertical circuit assembly and components of that circuit assembly, according to an implementation.

FIGS. 6A-6C are diagrams illustrating another vertical circuit assembly and components of that circuit assembly, according to an implementation.

FIGS. 7A-7F are diagrams illustrating another vertical circuit assembly and components of that circuit assembly, according to an implementation.

FIGS. 8A-8F are diagrams illustrating another vertical circuit assembly and components of that circuit assembly, according to an implementation.

FIGS. 9A and 9B are diagrams illustrating a circuit assembly, according to an implementation.

DETAILED DESCRIPTION

This disclosure, in part, relates to implementations of circuit assemblies (e.g., illustrated in FIGS. 1A-8E) that are configured be vertically mounted (attached, affixed, etc.) to a printed circuit board (PCB). Accordingly, for purposes of this disclosure, such circuit assemblies may be referred to as vertical circuit assemblies. Such vertical circuit assemblies can include a leadframe that has both bent (e.g., curved) power and signal pins, suitable for surface mounting (attaching, soldering, etc.) to a PCB, and straight power and signal pins, suitable for through-hole mounting (affixing, soldering, etc.) on a PCB. In other implementations, other power and signal pin arrangements are possible, such using all straight, through-hole mounted pins. This disclosure also relates to circuit assemblies, such as the implementation shown in FIGS. 9A and 9B that can be used in a horizontal implementation, or in a vertical implementation.

The approaches illustrated and described herein can be used to produce any number of different circuit assemblies for mounting to a PCB. However, for purposes of illustration and clarity, the embodiments illustrated and described herein will be discussed with respect to power converter (e.g., buck-converter) vertical circuit assemblies. Such buck converters can include a high-side field effect transistor (FET), a low-side FET, a control circuit, passive components (e.g., capacitors and resistors) and an output inductor, which, using the implementations described herein, can be integrated in a vertical circuit assembly that can be vertically mounted on a PCB. Such a vertical power converter circuit assembly can be implemented in a number of different devices, such as a server computer, a personal computer, a laptop computer, a netbook computer, and so forth.

In the implementations described herein, the high-side FET, the low-side FET and the control circuit can be implemented using one or more integrated circuits (ICs) or semiconductor devices (e.g., semiconductor chips). For instance, each of the high-side FET, the low-side FET and the control circuit can be implemented in a respective IC or semiconductor chip. In other implementations, the FETs can be implemented together in a single IC and the control circuit implemented in a second IC. In still other implementations all three of the high-side FET, the low-side FET and the control circuit can be monolithically implemented in a single IC or semiconductor chip.

Using vertical circuit assemblies, such as those disclosed herein, to implement such power converters can reduce a footprint area (e.g., an area of an associated PCB that is consumed/used when mounting a power converter circuit assembly) for adding power phases to increase peak power levels in an associated device or system, such as those indicated above. For instance, current power converter circuit assemblies have footprints on the order of 700-1225 $mm^2$. Using vertical circuit assemblies, such as those described herein, to implement functionally equivalent (substantially functionally equivalent) power converters can result in a (vertical) circuit assembly with a PCB footprint (area used for the power converter) on the order of 360 mm², which is a reduction in footprint (PCB area used) of approximately 50-70%.

Generally, the vertical circuit assemblies described herein, and illustrated in the drawings can include, in various combinations, a leadframe (e.g., a copper leadframe, etc.); a multi-chip (e.g., multiple semiconductor-device) assembly (which can include the high-side FET, the low-side FET and the control circuit of a corresponding power converter stage); an output inductor, a molding compound and one or more passive components (e.g., capacitors and/or resistors), where the leadframe, multi-chip assembly and the output inductor are arranged in a stacked configuration, such as the configurations described herein.

In such implementations, a multi-chip assembly of a given vertical circuit assembly can include a substrate (e.g., a ceramic substrate with printed signal lines and contact pads for mounting/solder components of the power converter) and/or a multi-chip package. Depending on the implementation, the high-side FET, the low-side FET and the control circuit can be included in a multi-chip package that is mounted on a substrate. Alternatively, the high-side FET, the low-side FET and the control circuit can be mounted (soldered, etc.) directly on a (ceramic) substrate (e.g., flip-chip mounted). Also, depending on the implementation, passive components of a power converter in such a vertical circuit assembly can be mounted on a substrate, included in a multi-chip package and/or mounted on a leadframe (e.g., between signal pins/leads of the leadframe). Further, depending on the implementation, an integrated output inductor can be solder mounted in the vertical circuit assembly or can be slide inserted in the vertical circuit assembly (e.g., frictionally held in place and in electrical contact in the vertical circuit assembly). Still further, in some implementations, contact areas configured for attachment of terminals of the output inductor can be sized so as to allow for different size inductors (e.g., with different pitches between inductor terminals).

For the implementations described herein, similar elements are referenced with like reference numbers of a respective sequence of reference numbers for each for a given implementation. For example, for the implementation illustrated in FIGS. 1A-1F, a leadframe is reference with reference number 110, while for the implementation illustrated in FIGS. 2A-2F, a leadframe is referenced with reference number 210, and for the implementation illustrated in FIGS. 3A-3E, a leadframe is referenced with reference number 310, and so forth. Similar numbering is used for other similar elements in the various drawings of the disclosure.

FIGS. 1A-1F are diagrams illustrating an embodiment of a vertical circuit assembly (assembly) 100 (and components of the assembly 100) that can be used to implement a power converter circuit. In other implementations, the assembly 100 (or a similar vertical circuit assembly) can be used to implement circuits other than a power converter circuit. The assembly 100 of FIGS. 1A-1F includes a leadframe 110, a substrate 120 (e.g., a printed ceramic substrate), an output inductor 130 and a molding compound 140, where the various views of FIGS. 1A-1F show the relationship of the various elements of the assembly 100 to one another. The assembly 100 can be referred to as fully-overmolded (e.g., injection molded, compression molded, etc.), as the entire assembly 100, with the exception of the power and signal pins of the leadframe 110 that are used to mount the assembly 100 to a PCB and an exposed surface of the substrate 120, is enclosed in the molding compound 140.

FIG. 1A is a plan, design layout view of the assembly 100, FIG. 1B is a cross-sectional view of the assembly 100 along the section line A-A in FIG. 1A, and FIG. 1C is a cross-sectional view of the assembly 100 along the section line B-B in FIG. 1A. The view of the assembly 100 shown in FIG. 1A can be referred to as an x-ray, plan view, as outlines of each element (component) of the assembly 100 are shown in FIG. 1A, so as to show their arrangement with respect to each other.

As shown in FIGS. 1A-1C, the substrate 120 can be flip mounted on the leadframe 110 (e.g., where solder connections on an upper surface of the substrate, such as shown in FIG. 1F, are coupled with, or soldered to the leadframe 110). In this implementation, a high-side FET, a low-side FET, a control circuit IC, and one or more passive devices can be affixed (soldered, etc.) to the substrate 120 prior to attaching the substrate 120 to the leadframe 110. Passive devices may also be directly affixed (soldered, etc.) to the leadframe 110. Alternatively, the high-side FET, the low-side FET, the control circuit IC, and the one or more passive devices could be attached to the substrate 120 using a same solder reflow process that is used to attach the substrate 120 to the leadframe 110. After overmolding the assembly 100, the molding compound 140 can be ground to expose the substrate 120, such as a backside of the substrate 120 as shown in FIGS. 1A and 1B (e.g., for heat-dissipation purposes during operation of the assembly 100). In some implementations, a heat slug or heatsink can also be affixed to the exposed substrate 120 to improve heat dissipation (e.g. reduce thermal resistance).

As shown in FIGS. 1A and 1B, 1D and 1E, the leadframe 110 can include a plurality of straight power and signal leads (pins) and a plurality of bent power and signal leads (pins) that are disposed along a single side (edge, etc.) of the assembly 100, which allows the assembly 100 to be vertically mounted on a PCB. As discussed above, the straight leads can be through-hole mounted in an associated PCB, while the bent leads can be surface mounted on the PCB. Straight leads can be, for example, leads that extend linearly away from the molding compound 140 without any curves or bends. Bent leads, for example, can have a first portion that extends linearly away from the molding compound 140 and a second portion (e.g., at distal end of the first portion) that is orthogonal to (substantially orthogonal to) the first portion, where the second portion can contact the PCB for surface mounting to signal traces on the PCB.

As shown in FIGS. 1A and 1C, the inductor 130 can include terminals 135 that are affixed (soldered, attached, contacted, etc.) to the leadframe 110. As noted above, in the assembly 100, the inductor 130 can be wholly enclosed (disposed) within the molding compound 140. FIG. 1D illustrates a top side view of the assembly 100, where the substrate 120 is exposed through the molding compound 140 (e.g., after grinding the molding compound 140). FIG. 1E shows a bottom side view of the fully overmolded assembly 100. FIG. 1F illustrates the substrate 120 with printed signal traces for operatively (e.g., electrically) coupling various components of the power converter of the assembly 100 with one another, and the leadframe 100 (and the inductor 130), such as a high-side FET, a low-side FET, a control circuit IC, and one or more passive devices.

FIGS. 2A-2F are diagrams illustrating an embodiment of a vertical circuit assembly (assembly) 200 (and components of the assembly 200) that can be used to implement a power converter circuit. In other implementations, the assembly 200 (or a similar vertical circuit assembly) can be used to implement circuits other than a power converter circuit. The assembly 200 of FIGS. 2A-2F includes a leadframe 210, a substrate 220 (e.g., a printed ceramic substrate), an output inductor 230 and a molding compound 240, where the various views of FIGS. 2A-2F show the relationship of the various elements of the assembly 200 to one another. The assembly 200 can be referred to as being partially-overmolded (e.g., injection molded, compression molded, etc.), as only the leadframe 210 and the substrate 220 (expect for the exposed surfaces of the leadframe 210 and the substrate 220 discussed below) are enclosed in the molding compound 240.

FIG. 2A is a plan, design (x-ray) layout view of the assembly 200, FIG. 2B is a cross-sectional view of the assembly 200 along the section line A-A in FIG. 2A and FIG. 2C is a cross-sectional view of the assembly 200 along the section line B-B in FIG. 2A.

As shown in FIGS. 2A-2C, the substrate 220 can be flip mounted on the leadframe 210. In this implementation, as with the assembly 100, a high-side FET, a low-side FET, a control circuit IC, and one or more passive devices can be affixed (soldered, etc.) to the substrate 220 prior to attaching the substrate 220 to the leadframe 210. Passive devices may also be directly affixed (soldered, etc.) to the leadframe 210. Alternatively, the high-side FET, the low-side FET, the control circuit IC, and the one or more passive devices could be attached to the substrate 220 using a same solder reflow process that is used to attach the substrate 220 to the leadframe 210. After overmolding the leadframe 210 and the substrate 220, the molding compound 240 can be ground to expose the substrate 220, such as a backside of the substrate 220 as shown in FIGS. 2A and 2B (e.g., for heat-dissipation purposes during operation of the assembly 200). In some implementations, a heat slug can also be affixed to the exposed substrate 220 to improve heat dissipation (e.g. reduce thermal resistance).

As shown in FIGS. 2A and 2B and 2D-2F, the leadframe 210 can include a plurality of straight power and signal leads (pins) and a plurality of bent power and signal leads (pins) that are disposed along a single side (edge, etc.) of the assembly 200, which allows the assembly 200 to be vertically mounted on a PCB. As discussed above, the straight leads can be through-hole mounted in an associated PCB, while the bent leads can be surface mounted on the PCB.

As shown in FIGS. 2A, 2B and 2G, the inductor 230 can include terminals 235 that are affixed (soldered, attached, contacted, etc.) to the leadframe 210 at contact pads 215. As shown in FIG. 2C, the molding compound 240 can include at least one mold cavity 245 that are formed during molding of the leadframe 210 and the substrate 220. As shown in FIG. 2E, the contact pads 215 (for coupling the inductor terminals 235 with the leadframe 210) can be exposed through the mold cavities 245. As noted above, in the assembly 200, the inductor 230 is not enclosed in the molding compound 240, and can be installed in the assembly 200 after molding and grinding the molding compound 240 to expose the substrate 220.

FIG. 2D illustrates a top side view of the assembly 200, where the substrate 220 is exposed through the molding compound 240 (e.g., after grinding the molding compound 240). FIG. 2E shows a bottom side view of the molded leadframe 210 and substrate 220, with the contact pads 215 (for the inductor terminals 235) exposed through the mold cavity 245 in the molding compound 240. FIG. 2F illustrates a bottom side view of the assembly 200 after attaching (soldering, affixing, etc.) the terminals 235 of the inductor 230 with the contact pads 215.

FIGS. 3A-3E are diagrams illustrating an embodiment of a vertical circuit assembly (assembly) 300 (and components of the assembly 300) that can be used to implement a power converter circuit. In other implementations, the assembly 300 (or a similar vertical circuit assembly) can be used to implement circuits other than a power converter circuit. The assembly 300 of FIGS. 3A-3E includes a leadframe 310 (with copper pedestals 315 attached for inductor terminal contact surfaces), a substrate 320 (e.g., a printed ceramic substrate), an output inductor 330 and a molding compound 340, where the various views of FIGS. 3A-3E show the relationship of the various elements of the assembly 300 to one another. As with the assembly 200, the assembly 300 can be referred to as being partially-overmolded (e.g., injection molded, compression molded, etc.), as only the leadframe 310, the substrate 320 and copper pedestals 315 (expect for the exposed surfaces of the pedestals 315 and the substrate 320 discussed below) are enclosed in the molding compound 340.

FIG. 3A is a plan, design (x-ray) layout view of the assembly 300, FIG. 3B is a cross-sectional view of the assembly 300 along the section line A-A in FIG. 3A and FIG. 3C is a cross-sectional view of the assembly 300 along the section line B-B in FIG. 3A.

As shown in FIGS. 3A-3C, the substrate 320 can be flip mounted on the leadframe 310. In this implementation, as with the assemblies 100 and 200, a high-side FET, a low-side FET, a control circuit IC, and one or more passive devices can be affixed (soldered, etc.) to the substrate 320 prior to attaching the substrate 320 to the leadframe 310. Passive devices may also be directly affixed (soldered, etc.) to the leadframe 310. Alternatively, the high-side FET, the low-side FET, the control circuit IC, and the one or more passive devices could be attached to the substrate 320 using a same solder reflow process that is used to attach the substrate 320 to the leadframe 310. After overmolding the leadframe 310, the copper pedestals 315 and the substrate 320, the molding compound 340 can be ground to expose the substrate 320, such as a backside of the substrate 320 (e.g., for heat-dissipation purposes during operation of the assembly 300), such as shown in FIGS. 3A and 3B. In some implementations, a heat slug can also be affixed to the exposed substrate 320 to improve heat dissipation (e.g. reduce thermal resistance). For the assembly 300, the molding compound 340 can also be ground to expose to expose contact surfaces of the copper pedestals 315 for contacting the terminals 335 of the inductor 330.

As shown in FIGS. 3A and 3B, 3D and 3E, the leadframe 310 can include a plurality of straight power and signal leads (pins) and a plurality of bent power and signal leads (pins) that are disposed along a single side (edge, etc.) of the assembly 300, which allows the assembly 300 to be vertically mounted on a PCB. As discussed above, the straight leads can be through-hole mounted in an associated PCB, while the bent leads can be surface mounted on the PCB.

As shown in FIGS. 3A, 3B and 3E, the inductor 330 can include terminals 335 that are affixed (soldered, attached, contacted, etc.) to the leadframe 310 through the copper pedestals 315. As shown in FIG. 3C, the copper pedestals 315 can be exposed through the molding compound 340, e.g., by grinding the molding compound 340, as discussed above. In certain implementations, the copper pedestals 315 can be sized so as to accommodate inductors 330 of various sizes (e.g., with different pitches between the inductor terminals 335). As noted above, in the assembly 300, the inductor 330 is not enclosed in the molding compound 340, and can be installed in the assembly 300 after molding and grinding to expose the substrate 220 and the copper pedestals 215.

As is also shown in FIG. 3C, the copper pedestals 315 may have a contact surface area (contact area, footprint, etc.) on the leadframe 310 (or, alternatively, on a substrate, such as the substrate 320, for example) that is smaller than a contact surface area (contact area, footprint, etc.) of the copper pedestals 315 that is exposed through the molding compound (e.g., for mounting the terminals 335 of the inductor 330) after grinding the molding compound 340. Using such an approach allows for attaching components (such as the inductor 330) with different terminal sizes and different terminal pitches (e.g., distance between terminals) to the exposed surface of the cooper pedestals 315, while having smaller contact surfaces on the leadframe 310 or the substrate 320, thus providing a larger exposed contact area than a contact area used to connect to the leadframe 310 or, depending on the implementation, to the substrate 320.

FIG. 3D illustrates a top side view of the assembly 300, where the substrate 320 is exposed through the molding compound 340 (e.g., after grinding the molding compound 340). FIG. 3E illustrates a bottom side view of the assembly 300 after attaching (soldering, affixing, etc.) the terminals 335 of the inductor 330 with the copper pedestals 315.

FIGS. 4A-4F are diagrams illustrating an embodiment of a vertical circuit assembly (assembly) 400 (and components of the assembly 400) that can be used to implement a power converter circuit. In other implementations, the assembly 400 (or a similar vertical circuit assembly) can be used to implement circuits other than a power converter circuit. The assembly 400 of FIGS. 4A-4F includes a leadframe 410, a substrate 420 (e.g., a printed ceramic substrate), an output inductor 430 and a molding compound 440, where the various views of FIGS. 4A-4F show the relationship of the various elements of the assembly 400 to one another. As with the assemblies 200 and 300, the assembly 400 can be referred to as being partially-overmolded (e.g., injection molded, compression molded, etc.), as only the leadframe 410 and the substrate 420 (expect for the exposed surfaces of the leadframe 410 and the substrate 420 discussed below) are enclosed in the molding compound 440.

FIG. 4A is a plan, design (x-ray) layout view of the assembly 400, FIG. 4B is a cross-sectional view of the assembly 400 along the section line A-A in FIG. 4A and FIG. 4C is a cross-sectional view of the assembly 400 along the section line B-B in FIG. 4A.

As shown in FIGS. 4A-4C, the substrate 420 can be flip mounted on the leadframe 410. In this implementation, as with the assemblies 100, 200 and 300, a high-side FET, a low-side FET, a control circuit IC, and one or more passive devices can be affixed (soldered, etc.) to the substrate 420 prior to attaching the substrate 420 to the leadframe 410. Passive devices may also be directly affixed (soldered, etc.) to the leadframe 410. Alternatively, the high-side FET, the low-side FET, the control circuit IC, and the one or more passive devices could be attached to the substrate 420 using a same solder reflow process that is used to attach the substrate 420 to the leadframe 410. After overmolding the leadframe 410 and the substrate 420, the molding compound 440 can be ground to expose the substrate 420, such as a backside of the substrate 420 as shown in FIGS. 4A, 4B, 4E and 4F (e.g., for heat-dissipation purposes during operation of the assembly 400). In some implementations, a heat slug can also be affixed to the exposed substrate 420 to improve heat dissipation (e.g. reduce thermal resistance).

As shown in FIGS. 4A and 4B and 4D-4F, the leadframe 410 can include a plurality of straight power and signal leads (pins) 412 and a plurality of bent power and signal leads (pins) 414 that are disposed along a single side (edge, etc.) of the assembly 400, which allows the assembly 400 to be vertically mounted on a PCB. As discussed above, the straight leads 412 can be through-hole mounted in an associated PCB, while the bent leads 414 can be surface mounted on the PCB.

As shown in FIGS. 4A, 4C and 4F, the inductor 430 can include a coil portion 432 and terminals 435 that are affixed (attached, contacted, etc.) to the leadframe 410 at contact pads 415. In the assembly 400, the inductor 440 can be slide inserted or tight fit and its terminals 435 can be frictionally held in place against the contact pads 415 (such as a result of mechanical pressure between the terminals 435 and the contact pads 415 due to contact of the molding compound 440 with the coil portion 432 of the inductor 430 on an opposite side of the assembly 400). Additionally, contact pads 415 and terminals 435 can also be welded by (laser beam, etc.) to firmly connect them. As shown in FIG. 4C, the molding compound 440 can include mold cavity 445 that are formed during molding of the leadframe 410 and the substrate 420. As shown in FIG. 4E, the contact pads 415 (for coupling the inductor terminals 435 with the leadframe 410) can be exposed through the mold cavity 445. As noted above, in the assembly 400, the inductor 430 is not enclosed in the molding compound 440, and can be installed (slide inserted) in the assembly 400 after molding and grinding the molding compound 440 to expose the substrate 420.

FIG. 4D illustrates a bottom side view of the assembly 400 before insertion of the inductor 430. FIG. 4E illustrates a top side view of the assembly 400 before insertion of the inductor 430, where the contact pads 415 and the substrate 420 are exposed through the molding compound 440 (e.g., after grinding the molding compound 440 to expose the substrate 420). FIG. 4F illustrates a top side view of the assembly 400 after attaching (slide inserting) the inductor 430 such that the inductor terminals 435 are in contact with the contact pads 415.

FIGS. 5A-5D are diagrams illustrating an embodiment of a vertical circuit assembly (assembly) 500 that can be used to implement a power converter circuit. In other implementations, the assembly 500 (or a similar vertical circuit assembly) can be used to implement circuits other than a power converter circuit. The assembly 500 of FIGS. 5A-5D includes a leadframe 510, a multi-chip module (multi-chip semiconductor device package) 520, an output inductor 530, a molding compound 540 and one or more passive devices 550, where the various views of FIGS. 5A-5D show the relationship of the various elements of the assembly 500 to one another. As with the assemblies 200, 300 and 400, the assembly 500 can be referred to as being partially-overmolded (e.g., injection molded, compression molded, etc.), as only the leadframe 510, the multi-chip module (MCM) 520 and the passive devices 550 (expect for the exposed surfaces of the leadframe 510 and the MCM 520 discussed below) are enclosed in the molding compound 540.

FIG. 5A is a plan, design (x-ray) layout view of the assembly 500, FIG. 5B is a cross-sectional view of the assembly 500 along the section line A-A in FIG. 5A, FIG. 5C is a cross-sectional view of the assembly 500 along the section line B-B in FIG. 5A and FIG. 5D is a cross-sectional view of the assembly 500 along the section line C-C in FIG. 5A. It is noted that the section lines in FIG. 5A for the assembly 500 are not straight section lines in order to show details of more features of the assembly 500 in the respective cross-sectional views of FIGS. 5B-5D than would be shown using straight section lines.

As shown in FIGS. 5A-5D, the MCM 520 can be mounted on the leadframe 510. In this implementation, a high-side FET, a low-side FET and a control circuit IC of a power converter can be included in the MCM 520. Further, in the assembly 500, one or more passive devices 500 (e.g., capacitors and/or resistors) can be affixed (soldered, etc.) directly to the leadframe 510 (e.g., as shown in FIGS. 5A, 5B and 5D) prior to, or after attaching the MCM 520 to the leadframe 510. Alternatively, the MCM 520, and the one or more passive devices 550, can be attached to the leadframe 510 using a same solder reflow process.

As shown in FIG. 5A-5C, the leadframe 510 can include a plurality of straight power and signal leads (pins) and a plurality of bent power and signal leads (pins) that are disposed along a single side (edge, etc.) of the assembly 500, which allows the assembly 500 to be vertically mounted on a PCB. As discussed above, the straight leads can be through-hole mounted in an associated PCB, while the bent leads can be surface mounted on the PCB.

As shown in FIGS. 5A, 5B and 5D, the inductor 530 can include terminals 535 that are affixed (soldered, attached, contacted, etc.) to the leadframe 510 (in similar fashion as with the contact pads 215 of the assembly 200). As shown in FIG. 5D, the molding compound 540 can include at least one mold cavity 545 (two are shown in, e.g., FIGS. 5A and 5D) that are formed during molding of the leadframe 510, the MCM 520 and the passive devices 550 with the molding compound 540. A portion of the leadframe 510 (for coupling the inductor terminals 535 to the leadframe 510) can be exposed through the mold cavities 545. As noted above, in the assembly 500, the inductor 530 is not enclosed in the molding compound 540, and can be installed in the assembly 500 after molding.

FIGS. 6A-6C are diagrams illustrating an embodiment of a vertical circuit assembly (assembly) 600 that can be used to implement a power converter circuit. In other implementations, the assembly 600 (or a similar vertical circuit assembly) can be used to implement circuits other than a power converter circuit. The assembly 600 of FIGS. 6A-6C includes a leadframe 610, with copper clips (which can be referred to as C-clips due to their cross-sectional "C" shape, but are not limited to a "C" shape) 615 attached to the leadframe 610 for providing inductor terminal contact surfaces, a MCM 620 (e.g., including a high-side FET, a low-side FET and a control circuit IC), an output inductor 630, a molding compound 640 and one or more passive devices 650 (or other components), where the various views of FIGS. 6A-6C show the relationship of the various elements of the assembly 600 to one another. As with the assemblies 200, 300, 400 and 500, the assembly 600 can be referred to as being partially-overmolded (e.g., injection molded, compression molded, etc.), as only the leadframe 610, the MCM 620, the C-clips 615 and the passive devices 650 (expect for the exposed surfaces of the C-clips 615 and the MCM 620 discussed below) are enclosed in the molding compound 640.

FIG. 6A is a plan, design (x-ray) layout view of the assembly 600, FIG. 6B is a cross-sectional view of the assembly 600 along the section line A-A in FIG. 6A and FIG. 6C is a cross-sectional view of the assembly 600 along the section line B-B in FIG. 6A. As with FIG. 5A of the assembly 500, it is noted that the section lines in FIG. 6A for the assembly 600 are not straight section lines, in order to show details of more features of the assembly 600 in the respective cross-sectional views of FIGS. 6B-6C than would be illustrated using straight section lines.

As shown in FIGS. 6A-6C, the MCM 620 can be mounted on the leadframe 610. Further, in the assembly 600, the one or more passive devices 650 (e.g., capacitors and/or resistors) can be affixed (soldered, etc.) directly to the leadframe 610 (e.g., as shown in FIGS. 5A and 5B) prior or after attaching the MCM 620 to the leadframe 610. Alternatively, the MCM 620 and the one or more passive devices 650 can be attached to the leadframe 610 using a same solder reflow process.

After overmolding the leadframe 610, the C-clips 615, the MCM 620 and the passive devices 650, the molding compound 640 can be ground to expose the contact pads 616 of the C-clips 615 for coupling terminals 635 of the inductor 630 with the leadframe 610.

As shown in FIGS. 6A and 6B, the leadframe 610 can include a plurality of straight power and signal leads (pins) 612 and a plurality of bent power and signal leads (pins) 614 that are disposed along a single side (edge, etc.) of the assembly 600, which allows the assembly 600 to be vertically mounted on a PCB. As discussed above, the straight leads 612 can be through-hole mounted in an associated PCB, while the bent leads 614 can be surface mounted on the PCB.

As shown in FIGS. 6A and 6C, the inductor 630 can include terminals 635 that are affixed (soldered, attached, contacted, etc.) to the leadframe 610 through the C-clips 615. As shown in FIG. 6C, the C-clips 615 can be exposed through the molding compound 640, e.g., by grinding the molding compound 640, as discussed above. In certain implementations, the C-clips 615 can be sized so as to accommodate inductors 630 of various sizes (e.g., with different pitches between the inductor terminals 635). As noted above, in the assembly 600, the inductor 630 is not enclosed in the molding compound 640, and can be installed in the assembly 600 after molding and grinding to expose the C-clips 615.

FIGS. 7A-7F are diagrams illustrating an embodiment of a vertical circuit assembly (assembly) 700 that can be used to implement a power converter circuit. In other implementations, the assembly 700 (or a similar vertical circuit assembly) can be used to implement circuits other than a power converter circuit. The assembly 700 of FIGS. 7A-7F includes a pre-molded leadframe 760, which includes a leadframe 710 and a molding compound 740. As shown in FIG. 7E, power and signal leads (pins) of the leadframe 710 can be exposed through the molding compound 740, so as to provide contact surfaces. The assembly 700 also includes a substrate 720 that has an MCM 720a mounted thereon, an output inductor 730 and one or more passive devices 750 mounted on the substrate 750. The various views of FIGS. 7A-7F show the relationship of the various elements of the assembly 700 to one another.

In the assembly 700, the substrate 720 (with the MCM 720a and the passives 750) can be affixed (attached, mounted, soldered) to the pre-molded leadframe 760. For instance, contact pads printed on the substrate 720 (as shown in FIG. 7D) can be affixed to corresponding contact surfaces of the leadframe 710 exposed through the molding compound 740 (as shown in FIG. 7E). Also in the assembly 700, in contrast with assemblies 100-600 and 800, terminals 735 of the inductor 730 can be affixed (attached, mounted, soldered) to the substrate 720, rather than to the leadframe, pedestals or C-clips.

As shown in FIGS. 7A, 7B, 7E and 7F, the leadframe 710 can include a plurality of straight power and signal leads (pins) and a plurality of bent power and signal leads (pins) that are disposed along a single side (edge, etc.) of the assembly 700, which allows the assembly 700 to be vertically mounted on a PCB. As discussed above, the straight leads can be through-hole mounted in an associated PCB, while the bent leads can be surface mounted on the PCB.

FIG. 7D illustrates top side and back side views of the substrate 720 with the MCM 720a and passive devices 750 mounted thereon. FIG. 7E shows a top side view of the pre-molded leadframe 760, which includes the leadframe 710 and the molding compound 740. FIG. 7F shows the x-ray plan view of the assembly 700 of FIG. 7A and a side view of the assembly 700 with sample dimensions given in millimeters. It will be appreciated that the implementations of the other drawings (FIGS. 1A-6C and 8A-8E) can have similar dimensions.

FIGS. 8A-8E are diagrams illustrating an embodiment of a vertical circuit assembly (assembly) 800 that can be used to implement a power converter circuit. In other implementations, the assembly 800 (or a similar vertical circuit assembly) can be used to implement circuits other than a power converter circuit. The assembly 800 of FIGS. 8A-8E includes a leadframe 810 (with copper pedestals 815 attached for inductor terminal contact surfaces), a MCM 820 (e.g., such as the MCMs 520 and 620), an output inductor 830, a molding compound 840, one or more passive devices 850 and a heat slug 870, where the various views of FIGS. 8A-8E show the relationship of the various elements of the assembly 800 to one another. As with the assemblies 200, 300, 400, 500 and 600, the assembly 800 can be referred to as being partially-overmolded (e.g., injection molded, compression molded, etc.), as only the leadframe 810, the pedestals 815 and the MCM 820 (except for the exposed surfaces of the pedestals 815 and the MCM 820 discussed below) are enclosed in the molding compound 840.

FIG. 8A is a plan, design (x-ray) layout view of the assembly 800, FIG. 8B is a cross-sectional view of the assembly 800 along the section line A-A in FIG. 8A, FIG. 8C is a cross-sectional view of the assembly 800 along the section line B-B in FIG. 8A and FIG. 8D is a cross-sectional view of the assembly 800 along the section line C-C in FIG. 8A. As with FIGS. 5A and 6A of the respective assemblies 500 and 600, it is noted that the section lines in FIG. 8A for the assembly 800 are not straight section lines, in order to show details of more features of the assembly 800 in the respective cross-sectional views of FIGS. 8B-8D than would be illustrated using straight section lines.

As shown in FIGS. 8A and 8C-8E, the MCM 820 can be mounted on the leadframe 810. Further, in the assembly 800, the one or more passive devices 850 (e.g., capacitors and/or resistors) can be affixed (soldered, etc.) directly to the leadframe 810 (e.g., as shown in FIGS. 8A and 8D) prior to attaching the MCM 820 to the leadframe 810. Alternatively, the MCM 820 and the one or more passive devices 850 can be attached to the leadframe 810 using a same solder reflow process.

After overmolding the leadframe 810, the pedestals 815, the MCM 820 and the passive devices 850, the molding compound 840 can be ground to expose the contact pads of the pedestals 815 for coupling terminals 835 of the inductor 830 with the leadframe 810. The molding compound 840 can also be ground to expose the MCM 820, which can have a heat slug 870 affixed therewith. Such an implementation can allow for efficient thermal dissipation from both the top side and bottom side of the assembly 800 (e.g., cooling on two sides of the assembly 800).

As shown in FIGS. 8A-8C and 8E, the leadframe 810 can include a plurality of straight power and signal leads (pins) and a plurality of bent power and signal leads (pins). As discussed above, the straight leads can be through-hole mounted in an associated PCB, while the bent leads can be surface mounted on the PCB.

As shown in FIGS. 8A, 8B and 8E, the inductor 830 can include terminals 835 that are affixed (soldered, attached, contacted, etc.) to the leadframe 810 through the pedestals 815. As shown in FIGS. 8B and 8D, the pedestals 815 can be exposed through the molding compound 840, e.g., by grinding the molding compound 840, as discussed above. In certain implementations, the pedestals 815 can be sized so as to accommodate inductors 830 of various sizes (e.g., with different pitches between the inductor terminals 835). As noted above, in the assembly 800, the inductor 830 is not enclosed in the molding compound 840, and can be installed in the assembly 800 after molding and grinding to expose the pedestals 815.

As is also shown in FIG. 8D (similar to the implementation shown in FIG. 3C), the copper pedestals 815 may have a contact surface area (contact area, footprint, etc.) on the leadframe 810 (or, alternatively, on a substrate, such as ceramic substrate or on the MCM 820, for example) that is smaller than a contact surface area (contact area, footprint, etc.) of the copper pedestals 815 that is exposed through the molding compound 840 (e.g., for mounting the terminals 835 of the inductor 830) after grinding the molding compound 840. Using such an approach allows for attaching components (such as the inductor 830) with different terminal sizes and different terminal pitches (e.g., distance between terminals) to the exposed surface of the cooper pedestals 815, while having smaller contact surfaces on the leadframe 810 or the substrate 820, thus providing a larger exposed contact area than a contact area used to connect to the leadframe 810 or, depending on the implementation, to the substrate 820.

FIG. 8E shows the x-ray plan view of the assembly 800 of FIG. 8A and a side view of the assembly 800 with sample dimensions given in millimeters. It will be appreciated that the implementations of the other drawings (FIGS. 1A-7F and 9A-9B) can have similar dimensions.

FIGS. 9A-9B are diagrams illustrating an embodiment of a circuit assembly (assembly) 900, which can be implemented as a horizontal circuit assembly or, alternatively, as a vertical circuit assembly, such as by including a leadframe with power and signal pins as shown in the embodiments illustrated in FIGS. 1A-8E. The circuit assembly 900 can be used to implement a power converter circuit assembly or other circuit assembly. As shown in FIGS. 9A and 9B, the assembly 900 includes an alternative embodiment of a C-clip 915 from the C-clip 615 shown in FIGS. 6A-6C.

As shown in FIG. 9A, the C-clip 915 can include a half-etched region 917 on an underside of an upper portion of the C-clip 915. The half-etched region 917 can be defined using one or more photolithography and/or etch processes, where a portion of the material (e.g., copper) of the C-clip 915 is removed to define the half-etched region 917. The C-clip 915 can then be attached (affixed, soldered, adhered, etc.) to a substrate 920 (e.g., a ceramic, printed circuit substrate or other substrate). As also shown in FIG. 9A (and FIG. 9B), a number of other components 950 (e.g., passive components, and so forth) can be disposed on the substrate 920, and can be disposed below (vertically below) the upper surface of the C-clip 915. Such an approach can allow for an overall size of the substrate 920 to be reduced, as the components 950 are attached to the substrate under the C-clip 915, rather than being laterally disposed outside a perimeter of the C-clip 915, which would require a larger substrate 920 than shown in FIGS. 9A and 9B.

After affixing (attaching, soldering, etc.) the C-clip 915 and the components 950 to the substrate 920, the C-clip and the components 940 can be overmolded with a molding compound 940. In the assembly 900 of FIG. 9A, the line 919 illustrates a (desired) grind depth (backgrind depth), which corresponds with the depth of the half-etched portion 917. As shown in FIG. 9B, after grinding the overmolded assembly 900 to the depth shown by line 919 in FIG. 9A, the C-clip 915 is separated into two separate conductors 915a and 915b, which are structurally supported by the molding compound 940. Using such an approach, a single C-clip 915 can be used to produce two separate electrical connections to the overmolded substrate 920 using the surfaces of the conductors 915a and 915b that are exposed through the molding compound 940. Similarly to the C-clip 615 and the inductor 630 shown in FIG. 6A-6C, a component, such as an inductor, or multiple components can be mounted, soldered, affixed, attached, etc. to the surfaces of the conductors 915a and 915b (of the C-clip 915) that are exposed through the molding compound 940.

In a first example, an apparatus can include a leadframe including a plurality of leads configured to be coupled with a printed circuit board. The plurality of leads can be disposed along a single edge of the apparatus. The apparatus can also include an assembly including a substrate and a plurality of semiconductor die disposed on the substrate. The assembly can be mounted on the leadframe. The apparatus can further include an inductor having a first terminal and a second terminal. The first terminal of the inductor can being coupled with the leadframe via a first contact pad, and the second terminal of the inductor can be coupled with the leadframe via a second contact pad. The leadframe, the assembly and the inductor can be arranged in a stacked configuration.

In a second example based on the first example, the substrate can include one of a ceramic substrate or a multi-chip package.

In a third example based on any one of the first and second examples, the apparatus can include a molding compound, the leadframe being disposed in the molding compound.

In a fourth example based on the third example, the assembly can be disposed in the molding compound.

In a fifth example based on any one of the third and fourth examples, the output inductor can be disposed in the molding compound.

In a sixth example based on any one of the third through fifth examples, a surface of the substrate of the assembly can be exposed through the molding compound.

In a seventh example based on any one of the third through sixth examples, the first contact pad and the second contact pad can be included in the leadframe, and respective surfaces of the first contact pad and the second contact pad can be exposed through the molding compound.

In an eighth example based on any one of the first through seventh examples, the apparatus can include at least one passive device coupled with the leadframe.

In an ninth example based on any one of first through eighth examples, the plurality of leads can include at least one straight lead and at least one bent lead, the at least one straight lead being configured to be coupled with a through-hole of the printed circuit board and the at least one bent lead being configured to be mounted on a surface of the printed circuit board.

In a tenth example based on any one of the first through sixth, the eighth and the ninth examples, the first contact pad and the second contact pad can include, respectively, a first copper pedestal coupled with the leadframe and a second copper pedestal coupled with the leadframe.

In an eleventh example based on any one of the first through sixth, the eighth and the ninth examples, the first contact pad and the second contact pad can include, respectively, a first copper clip coupled with the leadframe and a second copper clip coupled with the leadframe.

In a twelfth example based on any one of the first through eleventh examples, the first terminal of the output inductor and the second terminal of the output inductor can be soldered, respectively, to the first contact pad and the second contact pad.

In a thirteenth example based on any one of the first through fourth or sixth through twelfth examples, the first terminal of the output inductor and the second terminal of the output inductor can be frictionally held in contact with, respectively, the first contact pad and the second contact pad.

In a fourteenth example based on any one of the first through thirteenth examples, the assembly can be mounted on a first side of the leadframe; and the first terminal of the output inductor, and the second terminal of the output inductor can be coupled with a second side of the leadframe, the second side being opposite the first side.

In a fifteenth example based on any one of the first through thirteenth examples, the first terminal of the output inductor and the second terminal of the output inductor can be coupled with as same side of the leadframe on which the assembly is mounted.

In a sixteenth example, an apparatus can include a leadframe including a plurality of leads configured to be coupled with a printed circuit board, the plurality of leads being disposed along a single edge of the apparatus; an assembly including a substrate and a plurality of semiconductor die disposed on the substrate, the assembly being mounted on the leadframe; and an inductor having a first terminal and a second terminal. The first terminal of the inductor can be coupled with the leadframe via a first contact pad, and the second terminal of the inductor can be coupled with the leadframe via a second contact pad. The leadframe can be disposed between the assembly and the inductor.

In a seventeenth example based on the sixteenth example, the apparatus can include a molding compound, at least one of the leadframe, the assembly and/or the output inductor being disposed in the molding compound.

In an eighteenth example based on any one of the sixteenth and seventeenth examples, the plurality of leads can include at least one straight lead and at least one bent lead. The at least one straight lead can be configured to be coupled with a through-hole of the printed circuit board, and the at least one bent lead can be configured to be mounted on a surface of the printed circuit board.

In a nineteenth example based on any one of the sixteenth through eighteenth examples, the first contact pad and the second contact pad can include, respectively, a first copper pedestal coupled with the leadframe and a second copper pedestal coupled with the leadframe.

In a twentieth example based on any one of the sixteenth through eighteenth examples, the first contact pad and the second contact pad can include, respectively, a first copper clip coupled with the leadframe and a second copper clip coupled with the leadframe.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus comprising:
a leadframe including a plurality of leads;
an assembly including a substrate and a plurality of semiconductor die disposed on the substrate, the assembly being coupled to the leadframe;
a molding compound that at least partially encapsulates the leadframe and the assembly; and
an inductor having a first terminal and a second terminal, the first terminal of the inductor being electrically coupled with a first contact pad of the leadframe, the first contact pad being exposed through a mold cavity defined in the molding compound, at least a portion of the first terminal being recessed in the mold cavity,
the second terminal of the inductor being electrically coupled with a second contact pad of the leadframe, and
the leadframe, the assembly and the inductor being arranged in a stacked configuration.

2. The apparatus of claim 1, wherein:
the mold cavity is a first mold cavity;
the second contact pad is exposed through a second mold cavity defined in the molding compound; and
at least a portion of the second terminal is recessed in the second mold cavity.

3. The apparatus of claim 1, wherein the substrate includes a ceramic substrate.

4. The apparatus of claim 1, wherein the assembly include a multi-chip module.

5. The apparatus of claim 1, wherein a surface of the substrate is exposed through the molding compound.

6. The apparatus of claim 5, wherein the mold cavity is disposed on a first side of the apparatus, and the surface of the substrate exposed through the molding compound is disposed on a second side of the apparatus that is opposite the first side.

7. The apparatus of claim 1, further comprising at least one passive device coupled to the leadframe.

8. The apparatus of claim 1, wherein the plurality of leads of the leadframe includes at least one straight lead and at least one bent lead, the at least one straight lead being configured to be coupled with a through-hole of a printed circuit board and the at least one bent lead being configured to be mounted on a surface of the printed circuit board.

9. The apparatus of claim 1, wherein the first terminal of the inductor and the second terminal of the inductor are soldered, respectively, to the first contact pad and the second contact pad.

10. The apparatus of claim 1, wherein the first terminal of the inductor and the second terminal of the inductor are coupled with a same side of the leadframe to which the assembly is coupled.

11. The apparatus of claim 1, wherein the first terminal of the inductor and the second terminal of the inductor are coupled with an opposite side of the leadframe to which the assembly is coupled.

12. The apparatus of claim 1, wherein the plurality of leads of the leadframe are disposed along a single edge of the apparatus.

13. The apparatus of claim 1, wherein the inductor includes a coil that is disposed outside the molding compound.

14. An apparatus comprising:
a leadframe including a plurality of leads;
an assembly including a substrate and a plurality of semiconductor die disposed on the substrate, the assembly being coupled to the leadframe;
a molding compound that at least partially encapsulates the leadframe and the assembly; and
an inductor having a first terminal and a second terminal, the first terminal of the inductor being electrically coupled with a first contact pad of the leadframe, the first contact pad being exposed through a first mold cavity defined in the molding compound, at least a portion of the first terminal being recessed in the first mold cavity,
the second terminal of the inductor being electrically coupled with a second contact pad of the leadframe, the second contact pad being exposed through a second mold cavity defined in the molding compound, at least a portion of the second terminal being recessed in the second mold cavity, and
the assembly and the inductor each being disposed on a same side of the leadframe.

15. The apparatus of claim 14, wherein a surface of the assembly is exposed through the molding compound.

16. The apparatus of claim 14, further comprising at least one passive device coupled with the leadframe.

17. The apparatus of claim 14, wherein the substrate includes a ceramic substrate.

18. An apparatus comprising:
a leadframe including a plurality of leads;
an assembly including a substrate and a plurality of semiconductor die disposed on the substrate, the assembly being coupled to the leadframe;
a molding compound that at least partially encapsulates the leadframe and the assembly; and
an inductor having a first terminal and a second terminal,
the first terminal of the inductor being electrically coupled with a first contact pad of the leadframe, the first contact pad being exposed through a first mold cavity defined in the molding compound, at least a portion of the first terminal being recessed in the first mold cavity,
the second terminal of the inductor being electrically coupled with a second contact pad of the leadframe, the second contact pad being exposed through a second mold cavity defined in the molding compound, at least a portion of the second terminal being recessed in the second mold cavity, and
the assembly and the inductor each being disposed on opposite sides of the leadframe.

19. The apparatus of claim 18, wherein a surface of the assembly is exposed through the molding compound.

20. The apparatus of claim 18, wherein the substrate includes a ceramic substrate.

* * * * *